United States Patent
Masuda et al.

(10) Patent No.: US 9,412,930 B2
(45) Date of Patent: Aug. 9, 2016

(54) LAMINATED BODY AND PIEZOELECTRIC/ELECTROSTRICTIVE ELEMENT

(71) Applicant: NGK Insulators, Ltd., Nagoya-Shi (JP)

(72) Inventors: Izumi Masuda, Kitanagoya (JP); Naoki Ogawa, Tokai (JP); Takaaki Koizumi, Tajimi (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 322 days.

(21) Appl. No.: 14/225,909

(22) Filed: Mar. 26, 2014

(65) Prior Publication Data

US 2014/0292158 A1 Oct. 2, 2014

(30) Foreign Application Priority Data

Mar. 29, 2013 (JP) ................. 2013-070895

(51) Int. Cl.

| H01L 41/047 | (2006.01) |
| B32B 3/26 | (2006.01) |
| H01L 41/09 | (2006.01) |
| B32B 15/08 | (2006.01) |
| B32B 27/30 | (2006.01) |
| H01L 41/08 | (2006.01) |
| H01L 41/29 | (2013.01) |

(52) U.S. Cl.
CPC ............... *H01L 41/047* (2013.01); *B32B 3/26* (2013.01); *B32B 3/263* (2013.01); *B32B 15/08* (2013.01); *B32B 27/30* (2013.01); *H01L 41/081* (2013.01); *H01L 41/0973* (2013.01); *B32B 2255/00* (2013.01); *B32B 2457/00* (2013.01); *H01L 41/29* (2013.01); *Y10T 428/24545* (2015.01)

(58) Field of Classification Search
CPC .. H01L 41/081; H01L 41/047; H01L 41/0973
USPC ................... 310/358, 324, 328, 311, 323.06, 310/323.11, 363, 364; 252/62.9 R; 428/596
IPC ...................................... H01L 41/047
See application file for complete search history.

(56) References Cited

U.S. PATENT DOCUMENTS

| 7,019,438 B2* | 3/2006 | Takahashi | ........... B41J 2/14233 310/324 |
| 2009/0031214 A1* | 1/2009 | Chatow | ............ G06F 17/30864 715/251 |
| 2009/0102325 A1* | 4/2009 | Ozawa | ................ C01G 23/003 310/358 |
| 2012/0315500 A1* | 12/2012 | Koizumi | ............ H01L 41/0815 428/596 |

FOREIGN PATENT DOCUMENTS

JP 2010-103301 A1 5/2010

* cited by examiner

*Primary Examiner* — Thomas Dougherty
*Assistant Examiner* — Karen B Addison
(74) *Attorney, Agent, or Firm* — Burr & Brown, PLLC

(57) ABSTRACT

A laminated body has a substrate and a metallic layer. The substrate is composed of an inorganic material. The metallic layer is disposed on the substrate. One of the substrate and the metallic layer has a main body portion and a plurality of protruding portions. The protruding portions are formed on the main body portion. The protruding portions are embedded in the other of the substrate and the metallic layer. An outer diameter of each of the protruding portions is configured to decrease towards the main body portion.

5 Claims, 11 Drawing Sheets

LAMINATED BODY AND PIEZOELECTRIC/ELECTROSTRICTIVE ELEMENT

CROSS-REFERENCE TO RELATED APPLICATIONS

This application claims priority under 35 U.S.C. §119 to Japanese Patent Application No. 2013-070895, filed on Mar. 29, 2013. The entire disclosure of Japanese Patent Application No. 2013-070895 is hereby incorporated herein by reference.

TECHNICAL FIELD

The technology disclosed herein relates to a laminated body and a piezoelectric/electrostrictive element that includes an inorganic substrate and a metallic layer.

BACKGROUND INFORMATION

Conventionally, a piezoelectric/electrostrictive element that includes an inorganic substrate that is composed of a ceramic material and a metallic electrode that is disposed on the inorganic substrate is widely used (for example, see Japanese Patent Application Laid-Open No. 2010-103301).

Conventionally, the adhesion of an inorganic substrate and a metallic electrode is enhanced by use of a method configured to form unevenness on a surface of an inorganic substrate by use of a sandblasting method or chemical etching method.

SUMMARY

However, when a chemical etching method or a sandblasting method is used, there is a limit to the enhancement of adhesion since the unevenness is formed in a tapering configuration. As a result, when a mechanical or thermal load is applied to the piezoelectric/electrostrictive element, there is the problem that the adhesion between the inorganic substrate and the metallic electrode cannot be maintained.

This type of problem is not restricted to piezoelectric/electrostrictive elements and is of general application in relation to a structural body that includes a laminated body that has a metallic layer formed on an inorganic substrate configured by an inorganic material.

In light of the problems in the conventional techniques as described above, the object of the technology disclosed herein is to provide a laminated body and a piezoelectric/electrostrictive element that enhance the adhesion between an inorganic substrate and a metallic layer.

A laminated body has a substrate and a metallic layer. The substrate is composed of an inorganic material. The metallic layer is disposed on the substrate. One of the substrate and the metallic layer has a main body portion and a plurality of protruding portions. The protruding portions are formed on the main body portion. The protruding portions are embedded in the other of the substrate and the metallic layer. An outer diameter of each of the protruding portions is configured to decrease towards the main body portion.

The laminated body and the piezoelectric/electrostrictive element according to the technology disclosed herein enhance the adhesion between an inorganic substrate and a metallic layer.

BRIEF DESCRIPTION OF DRAWINGS

Referring now to the attached drawings which form a part of this original disclosure.

DETAILED DESCRIPTION OF EMBODIMENTS

Figure 1:
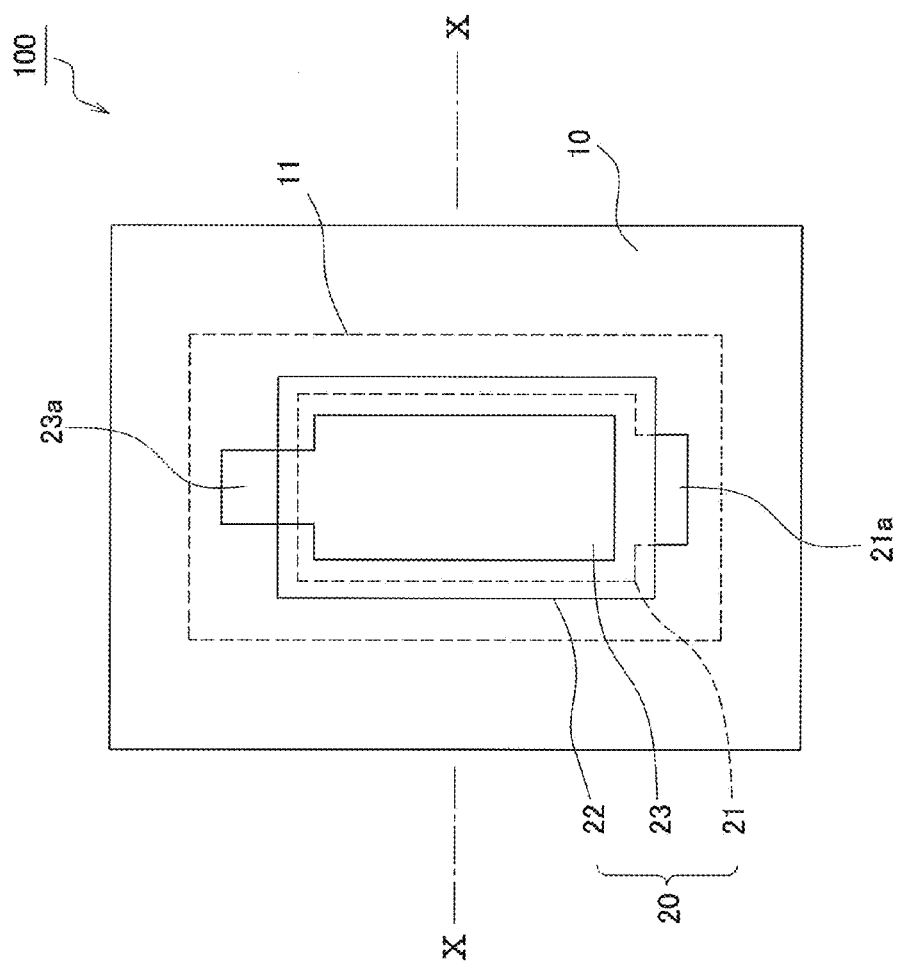
FIG. 1 is a plan view of a configuration of an actuator.

Next, an actuator provided with a piezoelectric/electrostrictive element that applies the laminated body according to the present invention will be described making reference to the drawings. However, the laminated body according to the present invention can be applied to various structural bodies in addition to a piezoelectric/electrostrictive element.

The same or similar portions disclosed in the following figures are denoted by the same or similar reference numerals. However, the figures are merely schematic, and the ratios of the respective dimensions or the like may differ from the actual values. Therefore, the actual dimensions or the like should be determined by making reference to the following description. In addition, it is naturally the case that portions are included that exhibit differences in relation to ratios or in relation to the relationship between mutual dimensions in different figures.

Configuration of Actuator 100

Figure 2:
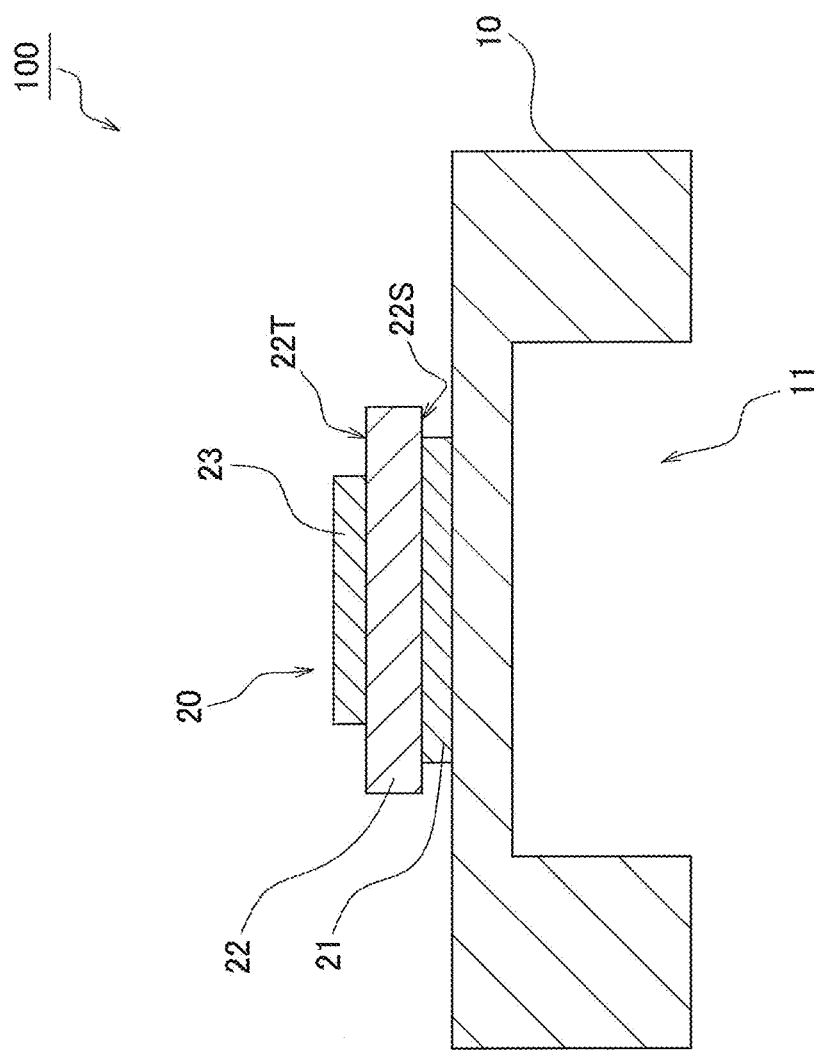
FIG. 2 is a sectional view along X-X in FIG. 1.

The configuration of an actuator 100 will be described making reference to the figures. FIG. 1 is a plan view of a configuration of an actuator. FIG. 2 is a sectional view along X-X in FIG. 1.

The actuator 100 includes a substrate 10 and a piezoelectric/electrostrictive element 20.

The substrate 10 is a tabular member configured by a ceramic material. The substrate 10 includes a recessed portion 11 formed on a lower surface. The flexure displacement of the piezoelectric/electrostrictive element 20 can be increased by formation of the recessed portion 11. The recessed portion 11 may be formed as a rectangle as illustrated in FIG. 2, or may have a shape including a square, a polygon, a circle, an oval, or a wedge.

The material for the substrate 10 preferably includes for example at least one substance selected from the group consisting of stabilized zirconium oxide, aluminum oxide, magnesium oxide, mullite, aluminum nitride, and silicon nitride, with stabilized zirconium oxide being particularly preferred due to superior mechanical strength and toughness.

The piezoelectric/electrostrictive element 20 is disposed on an upper surface of the substrate 10. The piezoelectric/electrostrictive element 20 includes a first electrode 21, a piezoelectric body 22 and a second electrode 23.

The first electrode 21 is an example of a metallic layer disposed on an inorganic substrate. The first electrode 21 is disposed on the substrate 10. The first electrode 21 includes a first tab 21a that is connected to an external power source.

The material used in the first electrode 21 includes a metal selected from the group consisting of platinum, palladium, ruthenium, gold, silver and alloys thereof.

The piezoelectric body 22 is formed in a tabular configuration, and as illustrated in FIG. 2, includes a first main surface 22S and a second main surface 22T. The first electrode 21 is connected to the first main surface 22S, and the second electrode 23 is connected to the second main surface 22T.

The material used in the piezoelectric body 22 is a conventional ceramic material for use in a piezoelectric body. More specifically, the ceramic material is a ceramic that contains one of the following substances in isolation, or a mixture thereof: lead zirconate, lead titanate, lead magnesium niobate, lead nickel niobate, lead zinc niobate, lead manganese niobate, lead antimony stanate, lead manganese tungstate, lead cobalt niobate, barium titanate, bismuth sodium titanate, sodium potassium niobate, strontium bismuth tantalite, or the like.

It is particularly preferred that a configuration is obtained that is a stabilized composition that exhibits low reactivity to the substrate configured by a ceramic during firing of the piezoelectric/electrostrictive layer and that has a high electromechanical coupling factor, and piezoelectric constant. For that purpose, use is preferred of a material that includes lead zirconate titanate (PZT) and lead magnesium niobate (PMN) as a main component, a material that includes bismuth sodium titanate as a main component, and furthermore a material that includes a three-component solid solution-substrated composition of lead titanate—lead zirconate—lead magnesium niobate as a main component to which is added nickel oxide and silicon oxide. Yet furthermore, use is preferred of a material that includes a two-component solid solution-substrated composition of lead titanate—bismuth nickel niobate as a main component.

A ceramic may be used in which the following substances are mixed or added in isolation to the above material: an oxide of lanthanum, calcium, strontium, molybdenum, tungsten, barium, niobium, zinc, nickel, manganese, cerium, cadmium, chrome, cobalt, antimony, iron, yttrium, tantalum, lithium, bismuth, tin, or the like. For example, an advantage of enabling adjustment of the coercive electric field or the piezoelectric characteristics may be obtained by addition of lanthanum or strontium to a main component of lead zirconate and lead magnesium niobate. Furthermore, the firing temperature may be decreased without causing a conspicuous reduction in characteristics by adding a eutectic compound of bismuth lead and lead oxide or a lithium compound such as lithium borate, lithium fluorine, lithium carbonate, or the like.

The second electrode 23 is disposed on the piezoelectric body 22. The second electrode 23 includes a second tab 23a that is connected to an external power source. The material of the second electrode 23 may be configured by the same material as the material for the first electrode 21.

Interface Structure for Substrate 10 and First Electrode 21

Figure 3:
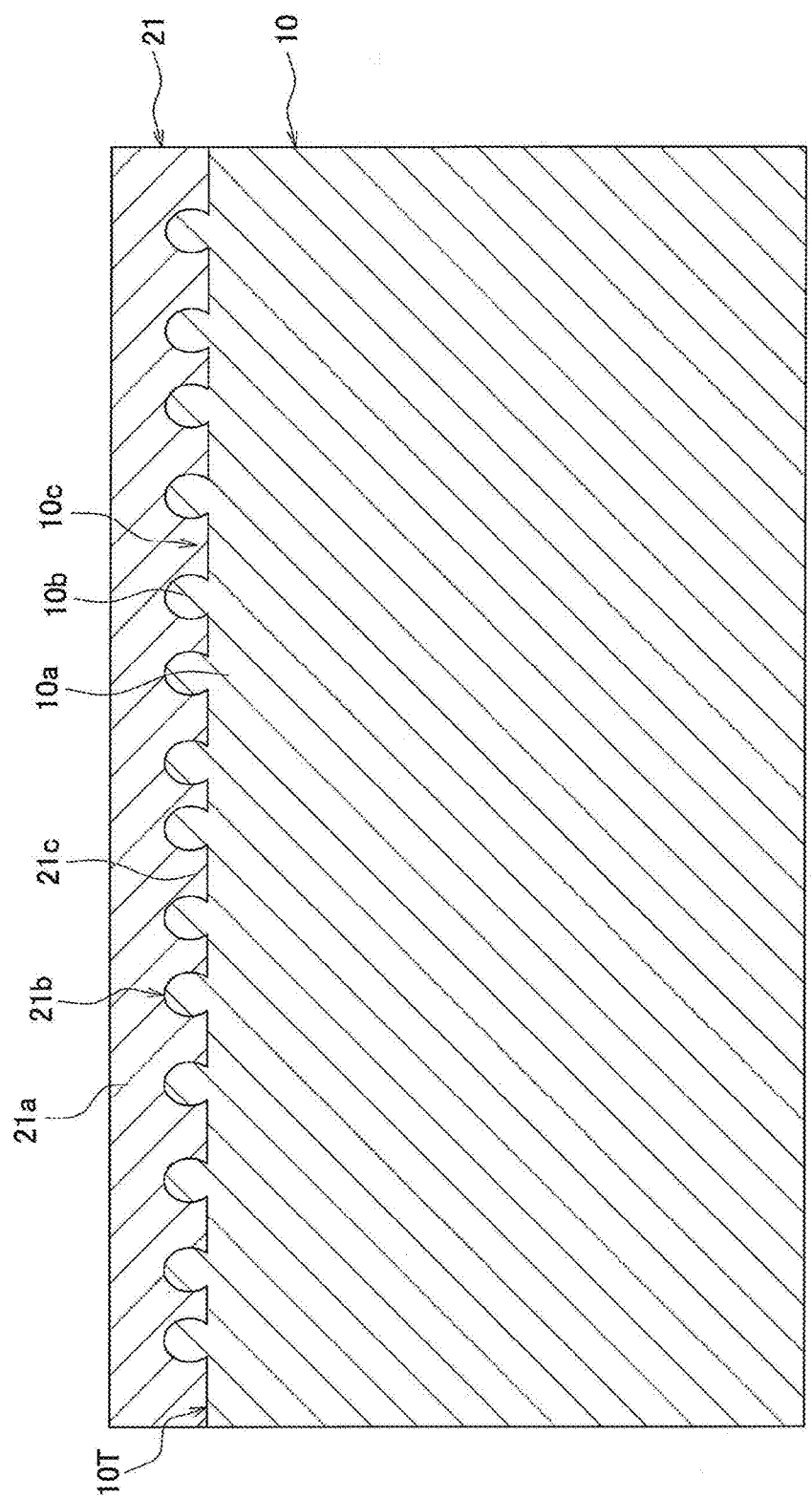
FIG. 3 is a partially enlarged view of FIG. 2.

Next, the interface structure for the substrate 10 and the first electrode 21 will be described making reference to the figures. FIG. 3 is an enlarged view of FIG. 2.

As illustrated in FIG. 3, the substrate 10 includes a main body portion 10a, a plurality of protruding portions 10b, and a plurality of recessed portions 10c. The first electrode 21 includes a main body portion 21a, a plurality of recessed portions 21b, and a plurality of protruding portions 21c.

The protruding portion 10b of the substrate 10 is formed on the surface 10T of the main body portion 10a. The protruding portion 10b is configured using a material that is the same as the main body portion 10a, or a material that includes the main body portion 10a as a main component, and is integrally formed with the main body portion 10a. The protruding portion 10b is embedded in the first electrode 21. More specifically, the protruding portion 10b is accommodated in the recessed portion 21b of the first electrode 21. In addition, the outer peripheral surface of the protruding portion 10b is tightly adhered to the inner peripheral surface of the recessed portion 21b. The detailed configuration of the protruding portion 10b will be described below.

The recessed portion 10c of the substrate 10 is formed on the surface 10T of the main body portion 10a. The recessed portion 10c is a pore space between the protruding portions 10b.

The main body portion 21a of the first electrode 21 functions as an electrode for the piezoelectric body 22. The thickness of the main body portion may be configured to 0.5 to 10 microns.

The protruding portion 10b of the substrate 10 is accommodated in the recessed portion 21b of the first electrode 21. The shape of the recessed portion 21b corresponds to the shape of the protruding portion 10b of the substrate 10.

The protruding portion 21c of the first electrode 21 is embedded in the substrate 10. More specifically, the protruding portion 21c is accommodated in the recessed portion 10c of the substrate 10. Furthermore, the outer peripheral surface of the protruding portion 21c is tightly adhered to the inner peripheral surface of the recessed portion 10c. In the present embodiment, the central portion of the protruding portion 21c is configured in the shape of tapering drum.

Configuration of Protruding Portion 10b of Substrate 10

Figure 4:
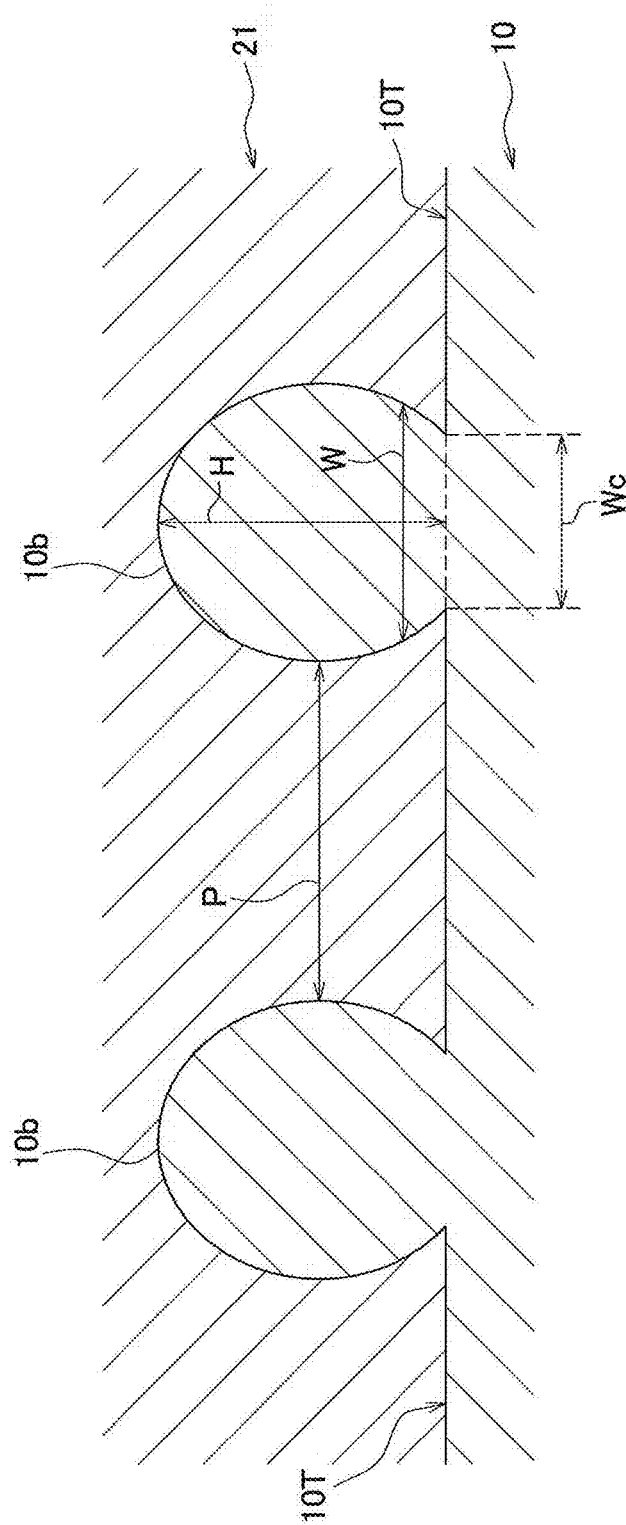
FIG. 4 is a partially enlarged view of FIG. 3.

Next, the configuration of the protruding portion 10b of the substrate 10 will be described making reference to the figures. FIG. 4 is an enlarged view of FIG. 3. FIG. 4 illustrates the sectional surface that is perpendicular to the surface 10T.

The protruding portion 10b exhibits a shape that narrows towards the surface 10T. More specifically, the central portion of the protruding portion 10b is formed as an ovoid with a narrowing lower end and a distended central portion. As a result, the outer diameter W of the protruding portion 10b decreases towards the main body portion 10a. In this manner, the anchoring effect of the protruding portion 10b is increased. The outer diameter W is the width of the protruding portion 10b in a direction that is parallel to the surface 10T.

The height H of the protruding portion 22b may be configured as 0.10 microns to 0.50 microns. The height H may be different in relation to each protruding portion 22b.

The average value of the interval between two adjacent protruding portions 10b (hereinafter "average opening width P") is preferably at least 0.15 microns. This is due to the reduction in the anchoring effect of the protruding portion 21c of the first electrode 21 as the average opening width P decreases. The opening width P may be different in relation to each two adjacent protruding portions 10b.

The average opening width P can be measured on an FE-SEM image. When performing the measurement, the interval between two protruding portions 10b in a direction parallel to a straight line fitted to the surface 10T by a least squares method may be taken as the opening width.

The bond width Wc of bonding of the protruding portion 10b to the main body portion 10a may be configured as 0.05 microns to 0.4 microns. As the bond width Wc increases, detachment of the protruding portion 10b from the main body portion 10a can be suppressed. The bond width Wc has the same definition as the outer diameter W of the lower end of the protruding portion 10b. The bond width Wc may differ in relation to each protruding portion 10b.

The ratio of the region of bonding by the plurality of protruding portions 10b to the surface 10T (hereinafter "bonding region") is preferably no more than 59.1%. This is due to the fact that the anchoring effect of the protruding portion 10b is decreased as the ratio of the bonding region increases. The ratio of the bonding region is measured as the total value of the bonding width Wc of the respective protruding portions 10b, and may be calculated by dividing the total value of the bonding width Wc by the total length of the surface 10T.

The ratio of the bonding region may be measured on an FE-SEM image. When performing the measurement, the ratio of the bonding width Wc in a direction parallel to a straight line fitted to the surface 10T by a least squares method may be taken as the ratio of the bonding region.

Method of Manufacturing Actuator 100

Next, the method of manufacturing the actuator 100 will be described.

Firstly, a slurry is prepared that includes ceramic powder for the main body portion 10a, a carrier, a dispersant, a plasticizing agent and a solvent.

Next, a molded body of the main body portion 10a is prepared by pressing a substrate material, that is configured in a clay state by milling and drying of the slurry, with a mold that is provided with a portion that corresponds to the recessed portion 11. However, the molded body of the main body portion 10a may be prepared by laminating a green sheet punched out by use of a punch into holes that correspond to the recessed portion 11.

Next, a slurry is prepared by mixing a pore forming agent (organic minute particles such as carbon or minute resin beads) and a dispersant, a plasticizer, and a solvent with the material powder that is the main component of the main body portion 10a or the same component as the main body portion 10a.

Next, the slurry is coated onto the molded body of the main body portion 10a using a spray coat method or a spin coat method, and predried for approximately 5 minutes at approximately 80 degrees C. to thereby prepare the molded body of the substrate 10.

Thereafter the molded body of the substrate 10 is placed into an electric furnace, heated for 1 to 5 hours at 3 Ts/4 (degrees C.) to Ts (degrees C.), and thereafter cooled to room temperature. Ts denotes the firing temperature of the molded body of the substrate 10. At that time, the pore forming agent included in the protruding portion 10b undergoes a redox reaction during firing, and the protruding portion 10b is formed by sintering of the ceramic powder.

Next, a photoresist of the predetermined pattern is developed on the surface of the substrate 10.

Next, after application of noble metallic atoms to form the catalytic nucleus for nonelectrolytic plating, patterning is performed by peeling of the photoresist.

Next, a salt of a precious metal, a complexing agent, a reducing agent, a pH adjusting agent, a stabilizer, and an additive and pure water are stirred and mixed to prepare the initial makeup of a noble metal plating solution.

After application of the catalytic nucleus to the substrate 10, the substrate 10 is immersed in the noble metal plating solution to thereby execute nonelectrolytic plating and thereby pattern the first electrode 21.

Next, after the first electrode is patterned on the substrate 10, the substrate 10 is placed into an electric furnace, heated under predetermined conditions, and then the plating residue or the residual gas in the plating film is removed by cooling to room temperature.

Then, a green sheet including the ceramic powder for the piezoelectric body 22, the carrier, the dispersant and the plasticizer is disposed on the first electrode.

Next, the substrate 10 that disposes the first electrode 21 and the piezoelectric body 22 is placed in an electric furnace, and degreased and fired under predetermined conditions.

A metal paste or metal resinate for the second electrode 23 is coated onto the piezoelectric body 22 using a spin coating method, a spray coating method, a screen printing method or the like, and fired to thereby prepare the molded body for the second electrode 23.

Operation and Effect

The substrate 10 includes the main body portion 10a and the plurality of protruding portions 10b that is embedded into the first electrode 21. The outer diameter W of the protruding portion 10b decreases towards the main body portion 10a.

Therefore, the adhesion between the substrate 10 and the first electrode 21 can be enhanced as a result of the increase in the anchoring effect of the protruding portions 10b in relation to the first electrode 21.

Other Embodiments

The present invention is not limited to the above embodiments and may be changed or varied in various ways within a scope that does not depart from the spirit of the invention.

Figure 5:
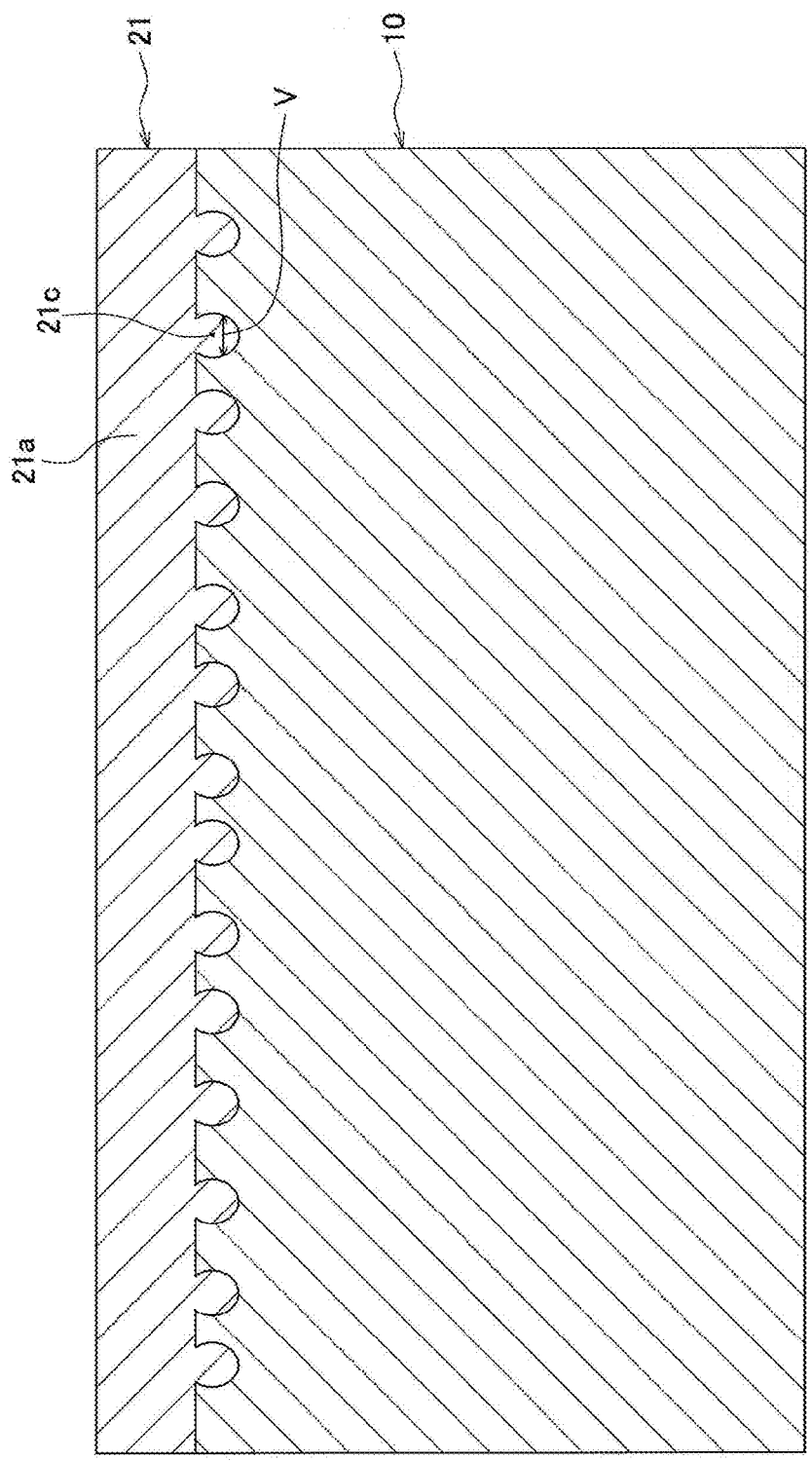
FIG. 5 is a sectional view illustrating the configuration of a first electrode and a substrate.

(A) In the above embodiments, although the outer diameter W of the protruding portion 10b of the substrate 10 decreases towards the main body portion 10a, as illustrated in FIG. 5, the outer diameter V of the protruding portion 21c of the first electrode 21 may decrease towards the main body portion 10a. The adhesion of the first electrode 21 and the substrate 10 is also enhanced in this configuration as a result of the increase in the anchoring effect of the protruding portion 21c on the substrate 10.

Figure 6:
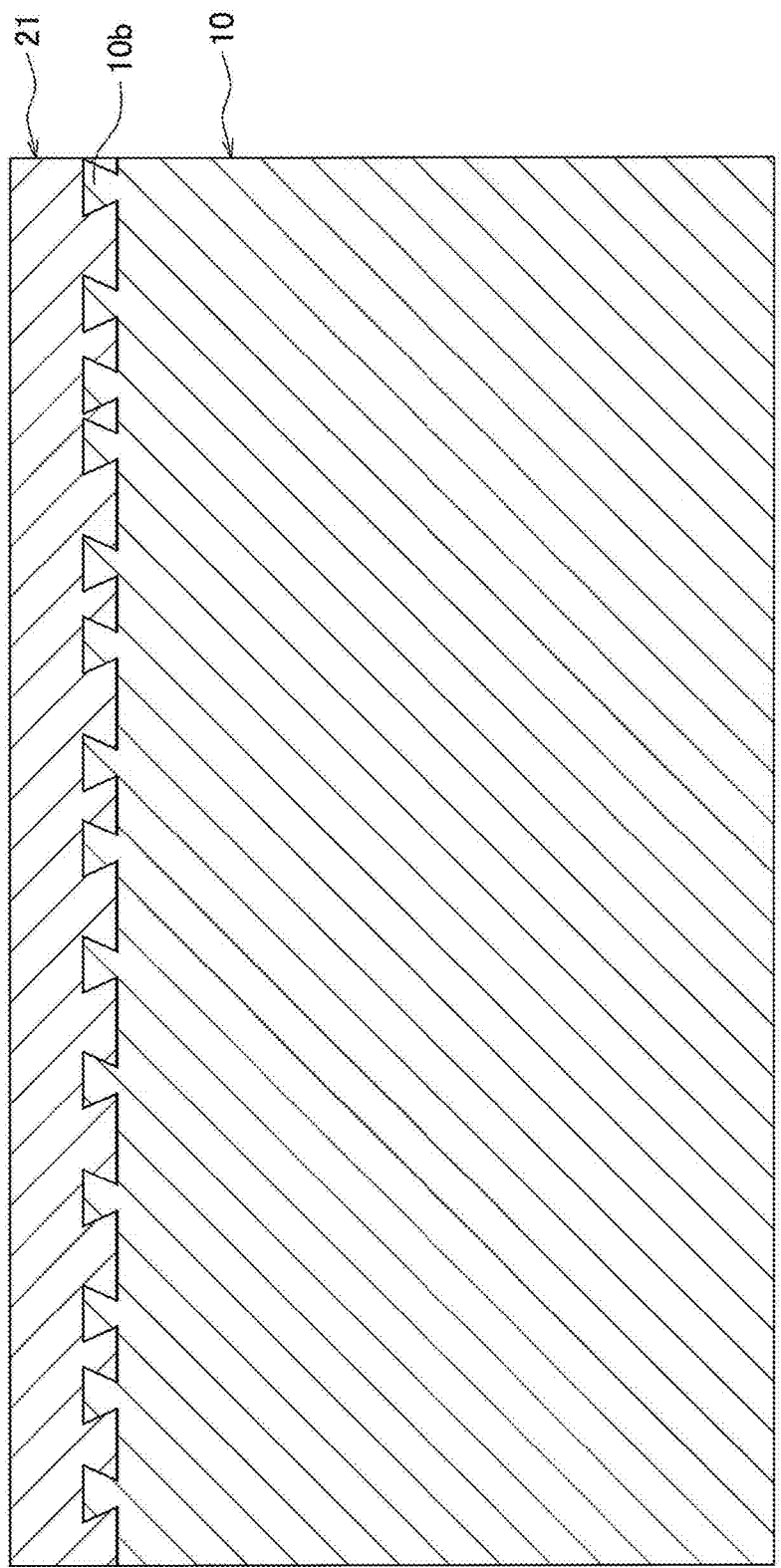
FIG. 6 is a sectional view illustrating the configuration of a first electrode and a substrate.
Figure 7:
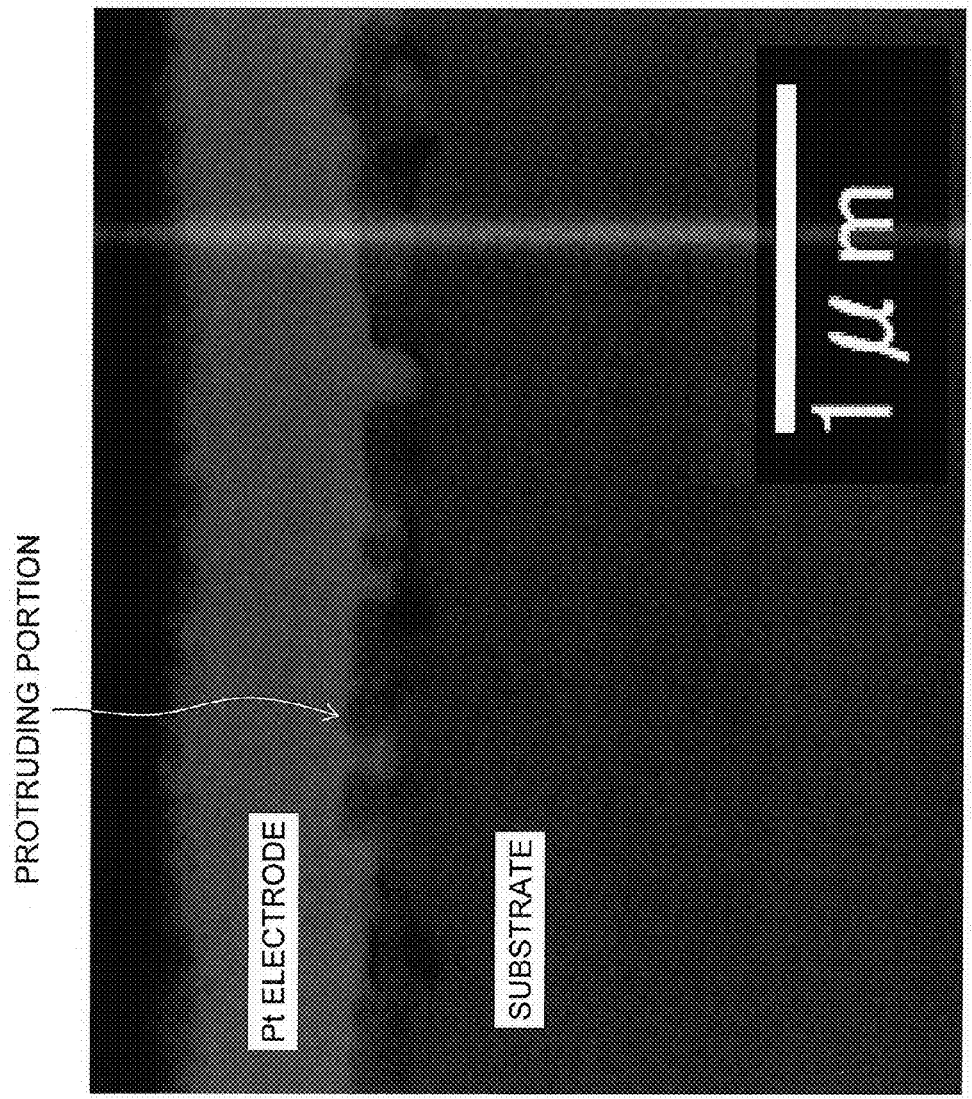
FIG. 7 is a SEM image of sample No. 1.
Figure 8:
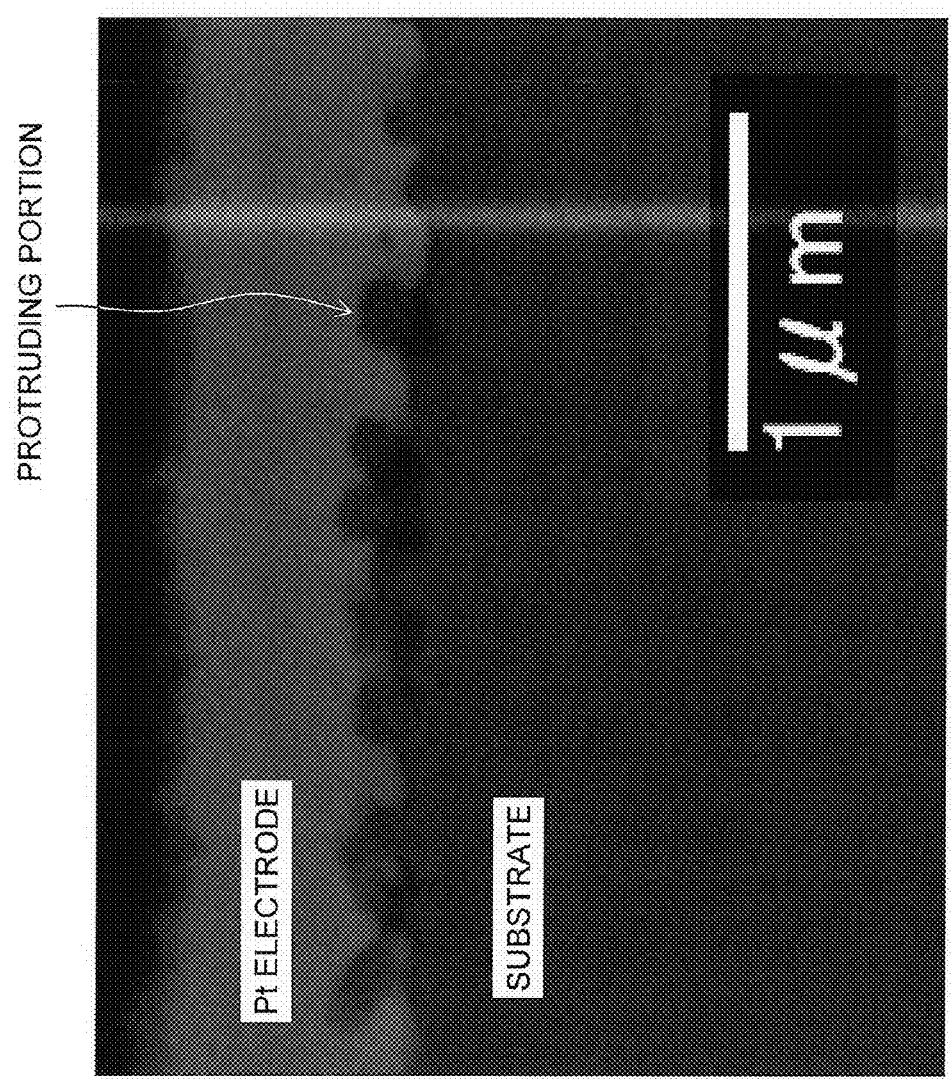
FIG. 8 is a SEM image of sample No. 2.
Figure 9:
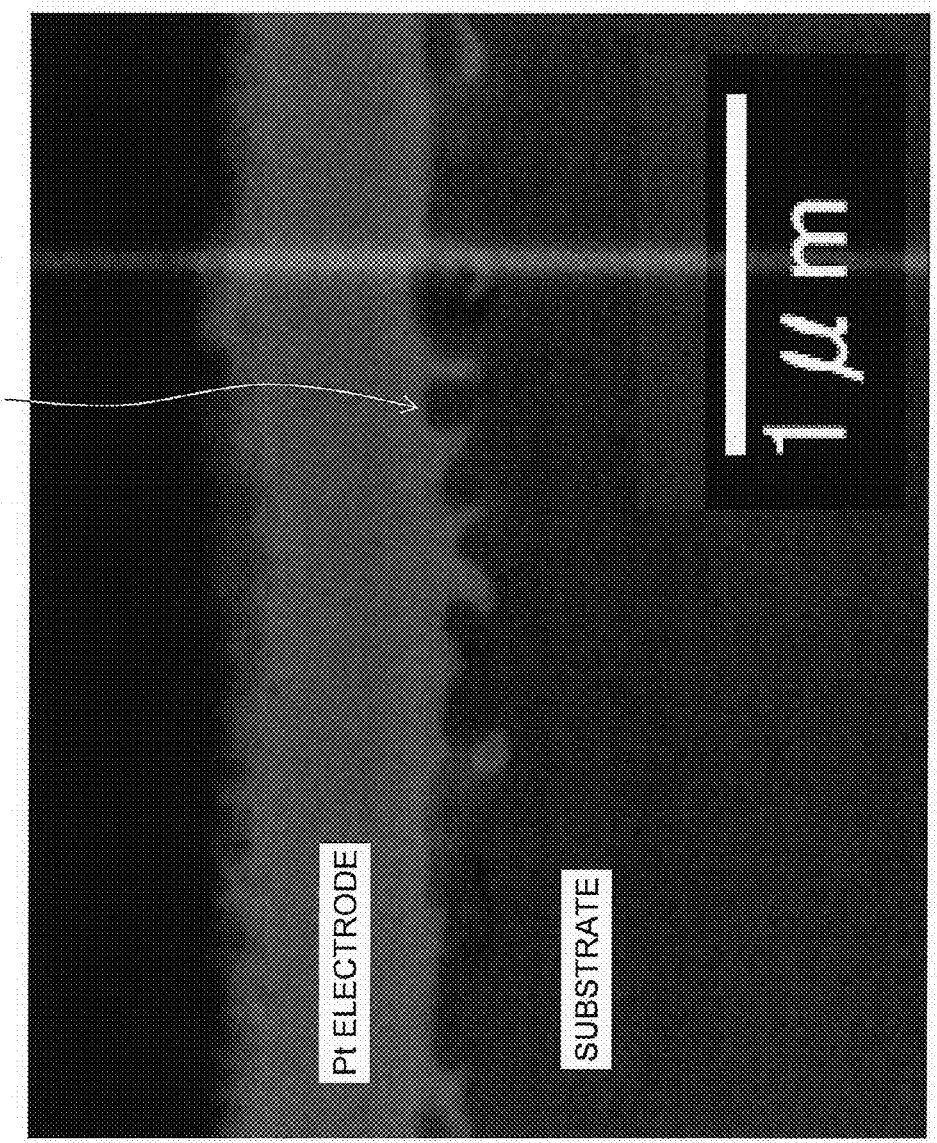
FIG. 9 is a SEM image of sample No. 5.
Figure 10:
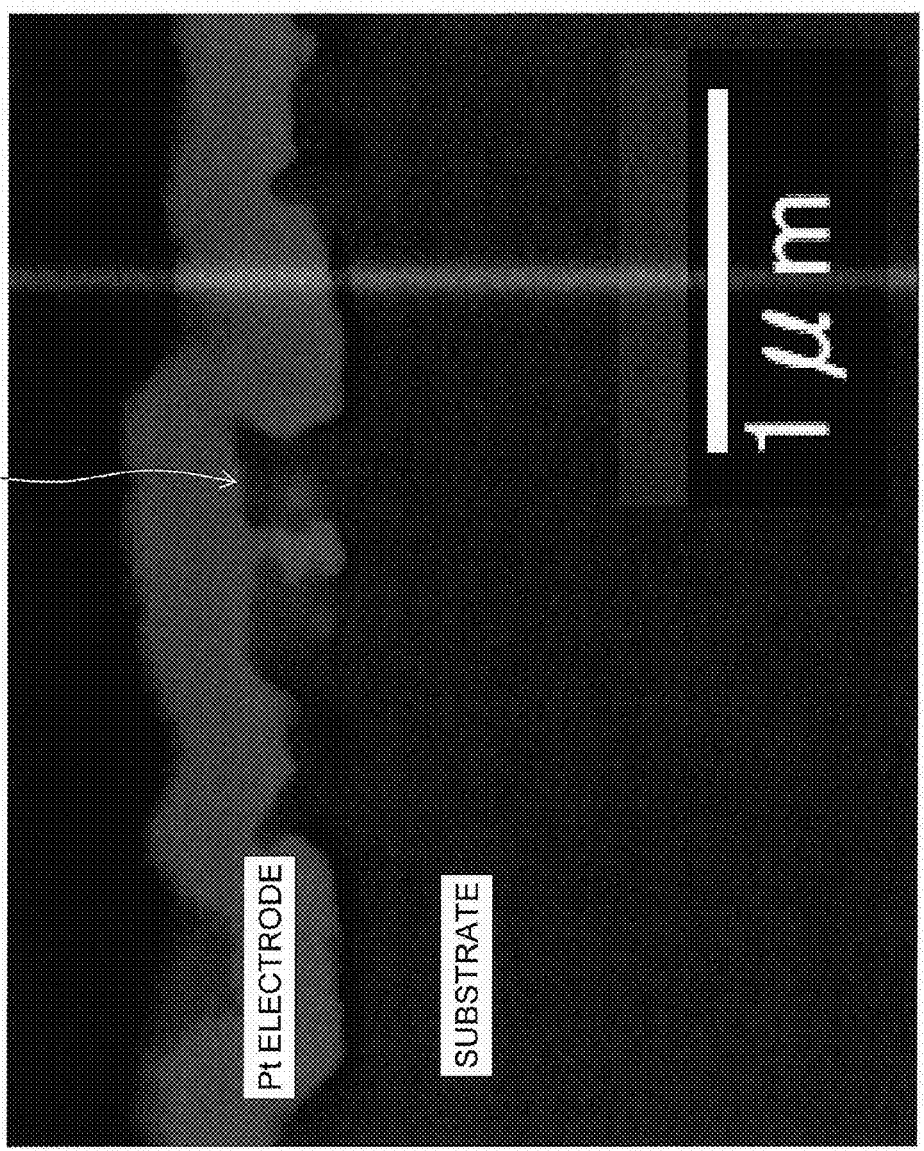
FIG. 10 is a SEM image of sample No. 8.

(B) In the above embodiments, although the protruding portion 10b is configured as an oval, there is no limitation in this regard. The connecting portion with the main body portion 10a of the protruding portion 10b may be formed in any tapering configuration towards the protruding portion 10T. Therefore, as illustrated in FIG. 6, the protruding portion 10b may be formed as an inverted cone or an inverted pyramid. Furthermore, although this is not illustrated in the figures, the protruding portion 10b may be formed in the shape of a bowl.

EXAMPLES

Although the examples of the present invention will be described hereafter, the invention is not thereby limited to the description of those examples.

Preparation of Samples No. 1 to No. 10

Samples No. 1 to No. 10 are prepared as shown below.

Firstly, a fired body for the main body portion having external dimensions of 50 mm×20 mm and a thickness of 0.25 mm is prepared by using partially stabilized zirconia.

Next, a slurry is prepared by mixing a pore forming agent, a dispersant, a plasticizer, and a solvent with partially stabilized zirconia powder, and is coated onto the fired body for the main body portion using a spray coating method. However, the pore forming agent is not added to sample No. 1. The added amount and the type of pore forming agent used in samples No. 2 to No. 10 are illustrated in Table 1.

Next, the main body after coating with the slurry is pre-dried for approximately 5 minutes at approximately 80 degrees C.

Next, the partially stabilized zirconia substrate for the main body that is configured with the coated and dried slurry is mounted onto a setter made from alumina and placed into an alumina sagger. At this time, an alumina spacer is used as a cover with the provision of a 5 mm space to allow for escape of gas.

The sagger is placed into an electric furnace and heated with a temperature increase of 200 degrees C/h to a maximum temperature of 1165 degrees C., and then after maintaining that temperature for two hours, allowed to cool naturally to room temperature. As described above, a substrate of partially stabilized zirconia configured with a roughened surface is obtained.

Next, a photoresist. PMER-N (manufactured by Tokyo Ohka Kogyo Co., Ltd.) is used to develop a predetermined electrode pattern onto the surface of the substrate.

Then, a platinum film as a catalytic nucleus for electroless plating is formed by sputtering on the surface of the substrate, and the catalytic nucleus is patterned by peeling of the resist.

Next, the platinum non-electrolytic plating solution (manufactured by Metalor Technologies Japan) is adjusted so that the resulting metal layer coincides with a desired thickness. The surface of the substrate is immersed in the plating solution that is maintained to a bath temperature of 40 degrees C. and pH 13, and subjected to rocking in a plating bath for 2 hours. In this manner, a Pt plated electrode with a thickness of 0.5 microns is formed.

Then, the substrate with the Pt plated electrode formed thereon is heated in an atmosphere of air with a temperature increase of 200 degrees C./h to a maximum temperature of 1100 degrees C. and maintained at that temperature for two hours to thereby remove residual gas from the Pt plated electrode, and then cooled to 600 degrees C. at 200 degrees C./h followed by natural cooling to room temperature.

Next, a green sheet having a thickness of 6 microns and formed from an electrode powder having lead zirconate titanate as a main component, a carrier formed from polyvinyl butyral, a dispersing agent and a plasticizer is cut and laminated onto the Pt plated electrode.

Next, heating is executed with a temperature increase of 500 degreesC/h to a maximum temperature of 1000 degrees C., and then after maintaining that temperature for two hours, cooling is allowed to naturally occur to room temperature. In this manner, a piezoelectric ceramic layer with a thickness of 3 microns is obtained.

Next, an Au resinate E-9802 (manufactured by Metalor Technologies Japan) is screen printed onto the piezoelectric ceramic layer and fired to thereby form an upper electrode layer having a thickness of 0.1 microns.

Next, a photolithography process is used to pattern using a resist so that the piezoelectric ceramic layer and the upper electrode layer exhibit a predetermined residual shape, and then etching is performed using AURAM-401 (manufactured by Kanto Chemical Co., Inc.) and a WPZ-2029 (manufactured by Adeka Corporation). In this manner, a piezoelectric/electrostrictive element that includes a piezoelectric ceramic layer and an upper electrode layer that exhibit a predetermined pattern is manufactured.

Preparation of Sample No. 11

Sample No. 1 to No. 10 exhibit roughening of the surface of a partially stabilized zirconia substrate by coating and firing of partially stabilized zirconia particles. However sample No. 11 exhibits roughening of the surface of a partially stabilized zirconia substrate as a result of chemical etching. More specifically, sample No. 11 is prepared as described below.

Firstly, in the same manner as samples No. 1 to No. 10, a fired body for the main body portion is prepared by use of partially stabilized zirconia.

Then, the main body portion is immersed in a 13% solution of hydrofluoric acid at 50 degrees C. for 10 minutes to thereby roughen the surface of the main body portion. At this time, deviation in the roughening of the substrate is suppressed by stirring of the solution using a diffusing pipe.

After passing through the same processing steps as those for samples No. 1 to No. 10, a piezoelectric/electrostrictive element is prepared on the surface of the main body portion.

Observation of the Protruding Portion

A sectional surface of samples No. 1 to No. 11 is observed using a FE-SEM (field emission scanning electron microscope) manufactured by JEOL at a magnification of 10,000. FIG. 7 to FIG. 11 are SEM images of samples No. 1, 2, 5, 8 and 11.

On the FE-SEM image, the ratio of the average opening width of two adjacent protruding portions and the bonding region of the protruding portion on the surface of the main body is calculated. The measurement of the ratio of the bonding region and the average opening width is performed with reference to a straight line that is fitted to the surface of the main body using a least squares method. The measurement results are summarized in Table 1.

Confirmation of Peeling Before/after Heating Test

Firstly, the presence or absence of peeling on the interface of the Pt plated electrode and the substrate is confirmed by microscope observation of a sectional surface of samples No. 1 to No. 11.

Then, samples No. 1 to No. 11 are heated from room temperature to 1000 degrees C. at an increase rate of 200 degrees C./h, and thereafter maintained at a temperature of 1000 degrees C. for two hours and then allowed to cool naturally to room temperature.

Then, the presence or absence of peeling on the interface of the Pt plated electrode and the substrate is confirmed by microscope observation of a sectional surface of samples No. 1 to No. 11. The confirmation results are summarized in Table 1.

TABLE 1

| Sample No. | Pore Forming Agent | | | Average Pore Width between Protrusions | Ratio of Bonding Region of Protruding Portions | External Appearance before/after Heating Test | | Evaluation Result |
|---|---|---|---|---|---|---|---|---|
| | Type | Particle Size | Added Amount | | | Before Heating | After Heating | |
| 1 | — | — | — | 0.11 μm | 65.0% | No problem | Minute Peeling | ○ |
| 2 | ADVANCELL K001(manufactured by Sekisui Chemical) | 150 nm | 5parts | 0.15 μm | 59.1% | No problem | No problem | ◎ |
| 3 | ADVANCELL K001(manufactured by Sekisui Chemical) | 150 nm | 10parts | 0.16 μm | 57.8% | No problem | No problem | ◎ |

TABLE 1-continued

| Sample No. | Pore Forming Agent Type | Pore Forming Agent Particle Size | Added Amount | Average Pore Width between Protrusions | Ratio of Bonding Region of Protruding Portions | External Appearance before/after Heating Test Before Heating | External Appearance before/after Heating Test After Heating | Evaluation Result |
|---|---|---|---|---|---|---|---|---|
| 4 | ADVANCELL K001(manufactured by Sekisui Chemical) | 150 nm | 15parts | 0.18 μm | 55.2% | No problem | No problem | ◎ |
| 5 | MDCNF (carbon nanotube) (manufactured by Mitsubishi Materials) | diameter 10-20 nm length 0.1-10 μm | 10parts | 0.20 μm | 51.1% | No problem | No problem | ◎ |
| 6 | MDCNF (carbon nanotube) (manufactured by Mitsubishi Materials) | diameter 10-20 nm length 0.1-10 μm | 20parts | 0.23 μm | 49.1% | No problem | No problem | ◎ |
| 7 | MDCNF (carbon nanotube) (manufactured by Mitsubishi Materials) | diameter 10-20 nm length 0.1-10 μm | 30parts | 0.25 μm | 47.5% | No problem | No problem | ◎ |
| 8 | Techpolymer BMSA-18GN (manufactured by Sekisui Chemical) | 800 nm | 10parts | 0.29 μm | 45.6% | No problem | No problem | ◎ |
| 9 | Techpolymer BMSA-18GN (manufactured by Sekisui Chemical) | 800 nm | 20parts | 0.36 μm | 42.3% | No problem | No problem | ◎ |
| 10 | Techpolymer BMSA-18GN (manufactured by Sekisui Chemical) | 800 nm | 30parts | 0.45 μm | 38.7% | No problem | No problem | ◎ |
| 11 | — | — | — | 0.30 μm | 50.9% | No problem | Peeling, Swelling | x |

Figure 11:
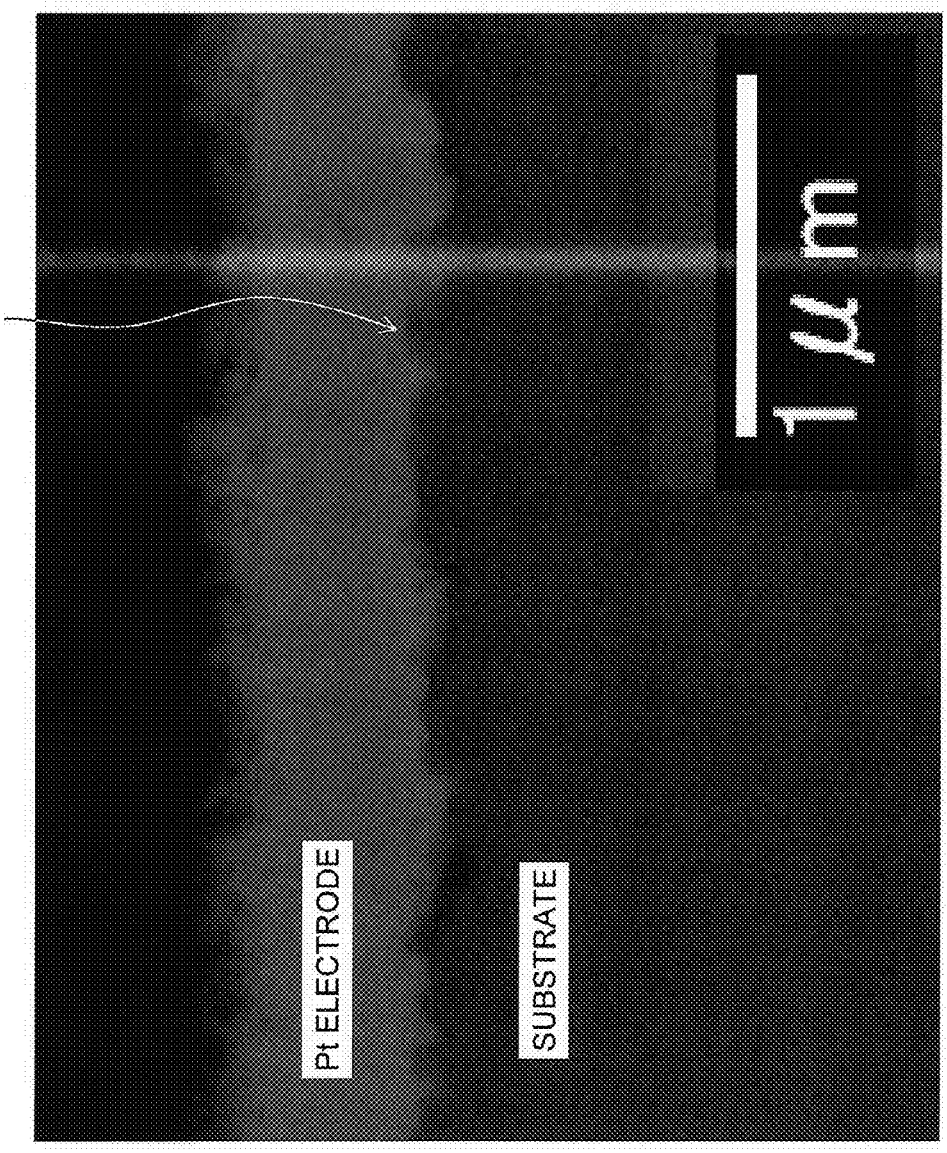
FIG. 11 is a SEM image of sample No. 11.

As shown in Table 1, sample No. 11, in which the surface of the main body portion is roughened by etching, is confirmed to exhibit blistering resulting from progressive peeling after the heating test. This is due to the fact that as shown in FIG. 11, the protruding portion of sample No. 11 is formed in a tapering configuration, and therefore the protruding portion exhibits a tendency to detach from the main body portion.

On the other hand, the external appearance after the heating test of samples No. 1 to No. 10 in which partially stabilized zirconia is coated and fired exhibits a superior result. As illustrated in FIG. 7 to FIG. 10, this is due to the fact that the adhesion of the Pt plated electrode and the substrate is enhanced by protruding portions that have an outer radius that decreases towards the main body portion.

As illustrated by Table 1, minute peeling after the heating test is confirmed in sample No. 1 which exhibits an average opening width between two protruding portions of 0.11 microns. This is due to the fact that the interval between protruding portions is narrow and there are few positions on the Pt plated electrode that are sandwiched by the protruding portions.

Peeling after the heating test is confirmed in samples No. 2 to No. 10 which exhibit an average opening width between two protruding portion of at least 0.15 microns. Therefore it is shown that an average opening width between two protruding portions of at least 0.15 microns is preferred.

As illustrated in Table 1, minute peeling after the heating test is confirmed in sample No. 1 that has a ratio of the bonding region of the protruding portions of 65.0%. This is due to the fact that the surface of the substrate is covered by the protruding portions and there are few positions on the Pt plated electrode that are sandwiched by the protruding portions.

Peeling after the heating test is confirmed in samples No. 2 to No. 10 that exhibit a ratio of the bonding region of the protruding portions of no more than 59.1%. Therefore it is shown that a ratio of the bonding region of the protruding portions of no more than 59.1% is preferred.

What is claimed is:

1. A laminated body comprising,
a substrate composed of an inorganic material;
a metallic layer disposed on the substrate;
one of the substrate and the metallic layer having a main body portion and a plurality of protruding portions, the protruding portions formed on the main body portion, the protruding portions embedded in the other of the substrate and the metallic layer, and
an outer diameter of each of the protruding portions configured to decrease towards the main body portion.

2. The laminated body according to claim 1, wherein
a ratio of a bonding region of the protruding portions on a surface of the main body portion is no more than 59.1%.

3. The laminated body according to claim 2, wherein
an average value of an interval between the protruding portions in a direction parallel to a surface of the main body portion is at least 0.15 microns.

4. The laminated body according to claim 1, wherein
an average value of an interval between the protruding portions in a direction parallel to a surface of the main body portion is at least 0.15 microns.

5. A piezoelectric/electrostrictive element comprising,
a substrate composed of an inorganic material;
a first electrode disposed on the substrate;
a piezoelectric body disposed on the first electrode, the piezoelectric body composed of a piezoelectric material;
a second electrode disposed on the piezoelectric body;
one of the substrate and the first electrode having a main body portion and a plurality of protruding portions, the protruding portions formed on the main body portion, the protruding portions embedded in the other of the substrate and the metallic layer; and
an outer diameter of each of the protruding portions configured to decrease towards the main body portion.

* * * * *